United States Patent [19]

Takeuchi

[11] Patent Number: 4,992,758
[45] Date of Patent: Feb. 12, 1991

[54] POWER AMPLIFYING APPARATUS FOR OPTICAL DISK APPARATUS

[75] Inventor: Ryoji Takeuchi, Yokohama, Japan

[73] Assignee: Kabushiki Kaisha Toshiba, Kawasaki, Japan

[21] Appl. No.: 277,175

[22] Filed: Nov. 29, 1988

[30] Foreign Application Priority Data

Nov. 30, 1987 [JP] Japan ................................ 62-302627
Nov. 30, 1987 [JP] Japan ................................ 62-302650

[51] Int. Cl.⁵ ........................ H03G 3/20; H03K 3/284
[52] U.S. Cl. .................................... 330/281; 307/273; 330/51
[58] Field of Search ...................... 330/51, 59, 75, 107, 330/132, 281, 308; 307/234, 273, 358

[56] References Cited

U.S. PATENT DOCUMENTS

| | | | |
|---|---|---|---|
| 3,875,523 | 4/1975 | Wade et al. ........................... | 330/69 |
| 3,988,685 | 10/1976 | Hughes ........................... | 307/273 X |
| 4,004,190 | 1/1977 | Simpson ........................... | 315/403 |
| 4,223,273 | 9/1990 | Yokoyama ........................... | 330/85 |
| 4,260,954 | 4/1981 | Crooks ........................... | 330/85 |

OTHER PUBLICATIONS

West German Office Action dated Jun. 14, 1989 for Application Ser. No. P 38 40 234.3-31.

Primary Examiner—Steven Mottola
Attorney, Agent, or Firm—Finnegan, Henderson, Farabow, Garrett, and Dunner

[57] ABSTRACT

A power amplifying apparatus for amplifying an input signal to drive a load, includes an amplifier for amplifying the input signal so as to generate an output signal for driving the load and a current/voltage converter for current/voltage converting the output signal generated by the amplifier and feeding back the converted voltage to the amplifier. The converted voltage is used to control the amplitude of the output signal which flows into the load. The power amplifying apparatus further includes a circuit for determining a current-to-voltage conversion ratio of the current/voltage converter. The amplitude of the converted voltage converted by the current/voltage converter may be varied in accordance with the current-to-voltage converting ratio determined by the determining circuit.

18 Claims, 7 Drawing Sheets

POWER AMPLIFYING APPARATUS FOR OPTICAL DISK APPARATUS

BACKGROUND OF THE INVENTION

1. Field of the Invention

The present invention relates to a power amplifying apparatus and, more particularly, to a power amplifying apparatus for a driver used in an optical disk apparatus.

2. Description of the Related Art

Power amplifiers are used in various sections of an optical disk apparatus, specifically, are used to drive driving coils for focusing and tracking control, a linear motor for an optical pickup, and a loading mechanism in an optical disk.

TC7256 (available from TOSHIBA CORP) is known as such a power amplifier. A current limiter is incorporated in this amplifier so as to prevent a current exceeding a continuous rated value from flowing through a load such as a driving coil. One end of a sensing resistor is connected to the output terminal of this amplifier, whereas the other end of the sensing resistor is connected to the load and the current limiting terminal of the current limiter. With this circuit arrangement, when an output current from the power amplifier flows through the sensing resistor, a voltage drop due to this sensing resistor occurs. As a result, a voltage corresponding to this voltage drop is applied to the current limiting terminal of the current limiter, and current limitation corresponding to this voltage is effected.

In the above-described power amplifier, however, the output of the power amplifier depends on the sensing resistor, which has a constant value. The use of this type of power amplifier is not suited for, say, focusing control, which requires an output current of a temporary excessive value in its intermittent operation.

In addition, when a loading mechanism is to be driven, a signal with logic levels is used. When this signal is at high level, a current flows through the load. Therefore, if a high-level signal continues for an excessively long period of time, an excessive load is applied to the load.

SUMMARY OF THE INVENTION

It is, therefore, an object of the present invention to provide a power amplifying apparatus capable of temporarily setting an output current to a value exceeding a continuous rated value in an intermittent operation such as focusing control.

It is another object of the present invention to provide a power amplifying apparatus capable of protecting a load from an excessive loading.

One of the above objects can be attained by a power amplifying apparatus for amplifying an input signal to drive a load, comprising means for amplifying the input signal so as to generate an output signal for driving the load, means for current/voltage converting the output signal generated by the amplifying means and feeding back the converted voltage to the amplifying means so as to control an amplitude of the output signal which flows into the load, and means for determining a current-to-voltage conversion ratio of the current/voltage converting means, wherein the amplitude of the converted voltage converted by the current/voltage converting means may be varied in accordance with the current-to-voltage converting ratio determined by the determining means.

Another object of the present invention can be attained by a power amplifying apparatus for amplifying an input signal to drive a load, comprising means for amplifying the input signal to drive the load, means for generating a plurality of output signals by receiving the input signal, means for outputting a signal for operating the amplifying means by receiving the plurality of output signals generated by the generating means, and means for preventing the signal for operating the amplifying means from outputting by the outputting means by receiving one of the plurality of input signals generated by the generating means.

BRIEF DESCRIPTION OF THE DRAWINGS

The foregoing aspects and other features of the invention will be explained in the following description taken in connection with the accompanying drawings wherein.

DETAILED DESCRIPTION OF THE PREFERRED EMBODIMENTS

An embodiment of the present invention will be described below with reference to the accompanying drawings.

Figure 1:
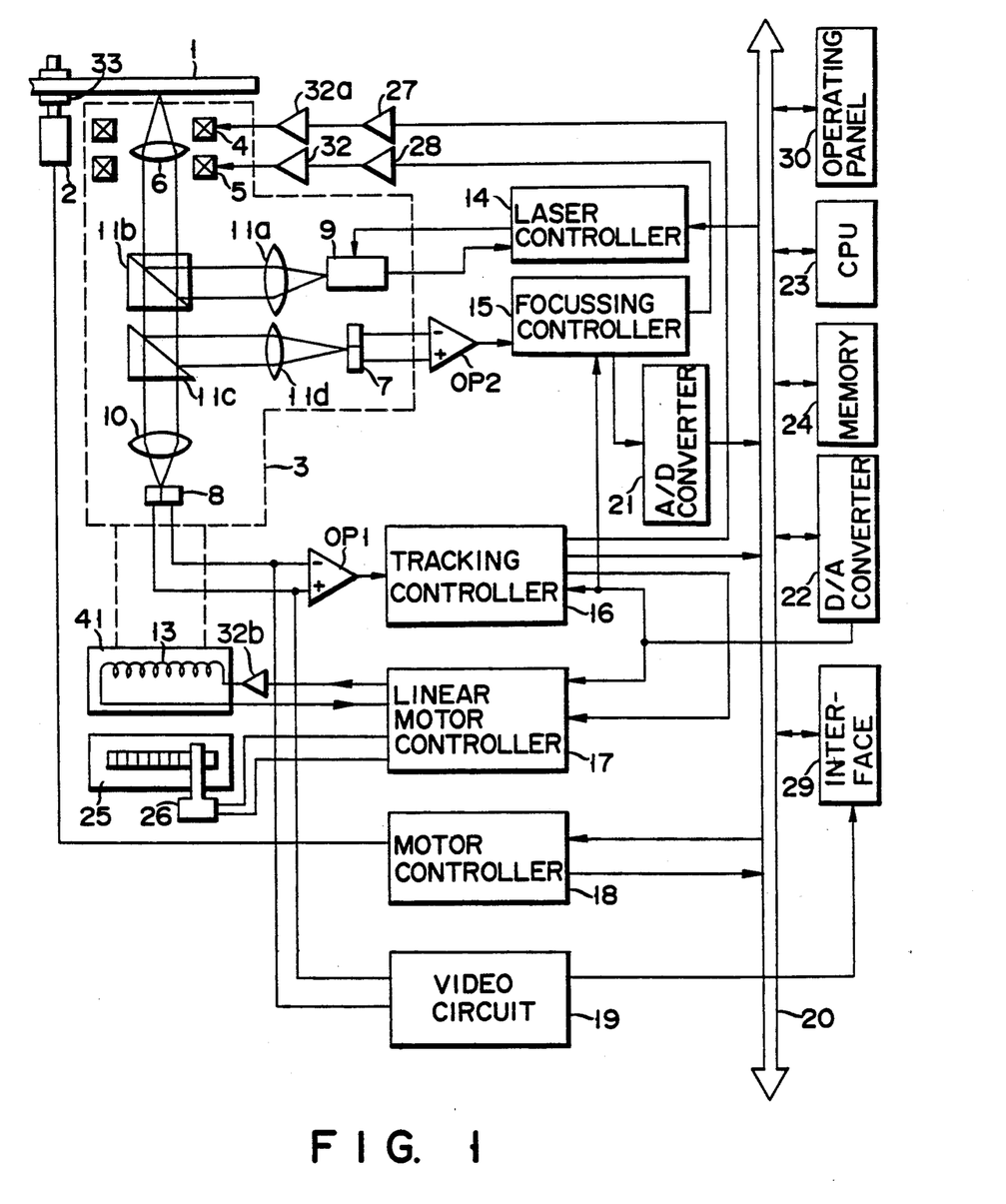
FIG. 1 is schematic block diagram showing anoptical disk apparatus to which a power amplifying apparatus of the present invention is applied.

FIG. 1 is a block diagram showing an optical disk apparatus to which a power amplifying apparatus of the present invention is applied.

Optical disk 1 is mounted on turntable 33 so as to be rotated by dc motor 2 at a predetermined speed. Speed control of dc motor 2 is performed by motor controller 18 connected thereto. Optical pickup 3 is arranged along the lower surface of optical disk 1. Optical pickup 3 is driven by linear motor 41. Linear motor 41 includes a permanent magnet (not shown) attached to its fixed portion and driving coil 13 attached to its movable portion. Linear motor 41 is connected to linear motor controller 17 through power amplifying apparatus 32b of the present invention. Linear motor controller 17 controls the speed of linear motor 41. Power amplifying apparatus 32b amplifies a control signal from linear motor controller 17 to a predetermined value. Upon driving of linear motor 41, optical pickup 3 is moved in the radial direction of optical disk 1. When optical pickup 3 is moved, position detector 26 attached to optical pickup 3 is moved together by the same distance. Optical scale 25 is fixed near position detector 26. Position detector 26 is connected to linear motor controller 17. Position detector 26 detects the moving distance of optical pickup 3 and a detection signal is supplied to linear motor controller 17.

Optical pickup 3 comprises driving coils 4 and 5, and objective lens 6. Objective lens 6 is supported by a leaf spring (not shown). Objective lens 6 is moved by driving coil 5 in its axial direction (a focusing direction), and is moved by driving coil 4 in a direction perpendicular to the focusing direction (a tracking direction).

Optical pickup 3 further includes semiconductor laser 9, photosensors 7 and 8, focusing lens 10, collimator lens 11a, beam splitter 11b, half prism 11c, and focusing lens 11d. Semiconductor laser 9 is driven by laser controller 14 arranged outside optical pickup 3. A laser beam emitted from semiconductor laser 9 is radiated onto a recording surface of optical disk 1 through collimator lens 11a, beam splitter 11b, and objective lens 6. The laser beam reflected by the recording surface of disk 1 is guided to half prism 11c through objective lens 6 and beam splitter 11b. Half prism 11c separates the reflected beam into two components. The first component of the reflected beam is supplied to photosensor 8 through focusing lens 10. The second component of the reflected beam is supplied to photosensor 7 through focusing lens 11d.

Photosensor 8 receives the first component of the reflected beam and generates two electrical signals. These signals are output to operational amplifier OP1. Operational amplifier OP1 generates a track-error signal by subtracting one of the two signals from the other. The track-error signal is supplied to tracking controller 16. Controller 16 outputs a tracking control signal to driving coil 4 through amplifier 27 and power amplifying apparatus 32a of the present invention. Power amplifying apparatus 32a amplifies the control signal from controller 16 to a predetermined value so as to supply it to driving coil 4. This tracking control signal is also supplied to linear motor controller 17.

Photosensor 7 receives the second component of the reflected beam and output two electrical signals representing a position where the laser beam is focused. These signals are output to operational amplifier OP2. Operational amplifier OP2 generates a focus-error signal by subtracting one of the two signals from the other. The focus-error signal is supplied to focusing controller 15. Focusing controller 15 applies a control voltage corresponding to the focusing error to amplifier 28 and power amplifying apparatus 32 of the present invention. Power amplifying apparatus 32 amplifies the control voltage from controller 15 to a predetermined value so as to apply it to driving coil 5. Objective lens 6 is moved by a predetermined distance upon driving of driving coil 5, thereby focusing the laser beam onto the recording surface of optical disk 1.

The two signals output from photosensor 8 are also supplied to video circuit 19 as signals reproduced from the recording surface of optical disk 1. Video circuit 19 converts these signals into binary values and send them to interface 29.

Laser controller 14, focusing controller 15, tracking controller 17, motor controller 18, and video circuit 19 are all connected to CPU 23 through bus line 20, and are controlled by CPU 23. CPU 23 executes programs stored in memory 24 in accordance with commands supplied through operating panel 30 connected to bus line 20.

A/D converter 21 is connected between focusing controller 15 and bus line 20. D/A converter 22 is connected to bus line 20. A/D converter 21 is used to exchange data between focusing controller 15 and CPU 23. D/A converter 22 is used to exchange data between tracking and linear motor controllers 16 and 17, and CPU 23.

Figure 2:
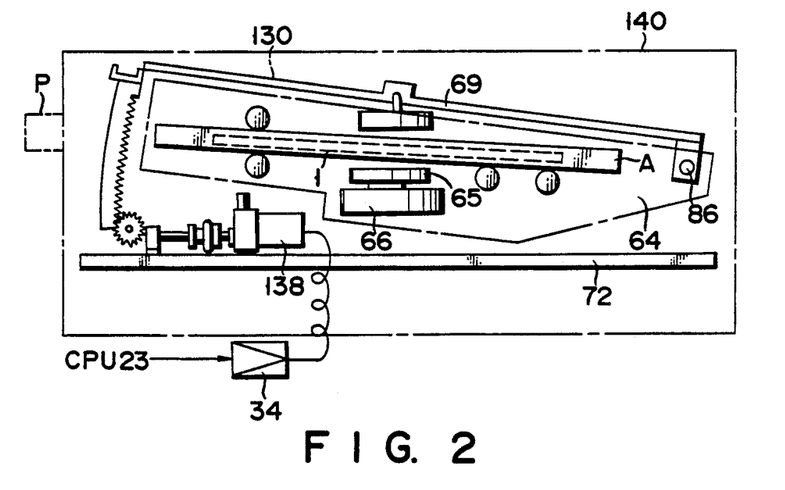
FIG. 2 is a view showing a disk loading mechanism to which the power amplifying apparatus of the present invention is applied.

FIG. 2 shows disk loading mechanism 140 to which power amplifying apparatus 34 of the present invention is applied. A loading operation will be described below.

Driving motor 138 receives a loading command signal from CPU 23 through power amplifying apparatus 34 of the present invention, and is driven in one direction. With this operation, movable member 130 is vertically pivoted around shaft 86. At the same time, cartridge conveying/opening/closing unit 64 is vertically pivoted. When unit 64 is moved to the uppermost limit, disk cartridge A can be inserted in unit 64 through port P. At this time, driving motor 138 is stopped. Upon insertion of cartridge A, driving motor 138 is driven in the opposite direction so as to move movable member 130 downward. At the same time, unit 64 is moved downward, and disk 1 is placed on turntable 65 fixed to driving motor 66. In this case, although unit 64 is stopped, driving motor 138 is not stopped, and hence movable member 130 is further moved downward. With this operation, disk 1 is displaced by clamper 69 with respect to turntable 65. Subsequently, driving motor 138 is stopped, and movable member 130 is stopped.

Figure 3:
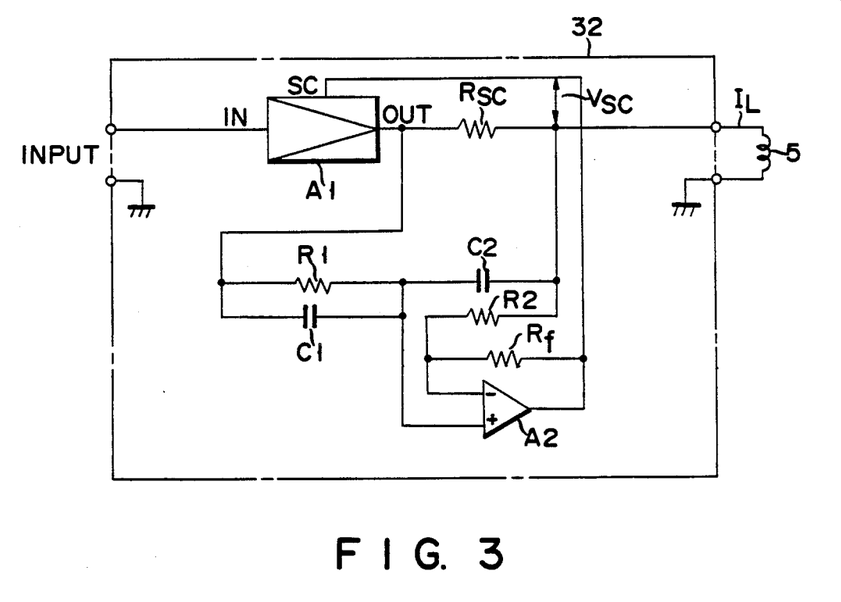
FIG. 3 is a block diagram showing a power amplifying apparatus according to an embodiment of the present invention, wherein a focusing control driving coil is used as a load.

FIG. 3 is a schematic view showing an arrangement of power amplifying apparatus 32 of the present invention, wherein driving coil 5 for focusing control is used as a load.

Power amplifying apparatus 32 comprises power amplifier A1, sensing resistor $R_{SC}$, a first time constant circuit constituted by resistor R1 and capacitor C1, a second time constant circuit constituted by resistor R1 and capacitor C2, and operational amplifier A2 as a current-to-voltage conversion circuit. Power amplifier A1 includes input terminal IN for receiving a control signal from focusing controller 15 through amplifier 28, output terminal OUT, and current limiting control terminal (current limiting terminal) SC. Current limiting control terminal SC corresponds to one terminal of a current limiter (to be described later) arranged in above-described power amplifier A1. Driving coil 5 is connected to output terminal OUT of power amplifier A1 through sensing resistor $R_{SC}$. Resistor R1 and capacitor C1 constituting the first time constant circuit, resistor R1 and capacitor C2 constituting the second time constant circuit, and operational amplifier A2 are connected between both terminals of sensing resistor RSC. More specifically, one terminal (on the side of output terminal OUT of power amplifier Al) of sensing resistor RSC is connected to the noninverting input terminal of operational amplifier A2 through resistor R1, and capacitor C1 is connected between both terminals of resistor R1. One of the nodes between resistor R1 and capacitor C1 is connected to the inverting input terminal of operational amplifier A2 through capacitor C2 and resistor R2. In addition, the node between capacitor C2 and resistor R2 is connected to the other terminal of sensing resistor $R_{SC}$. The output terminal of operational amplifier A2 is connected to current limiting control terminal SC of power amplifier Al, and at the same time is connected to the inverting input terminal of operational amplifier A2 through feedback resistor Rf.

A case wherein a stepwise input signal is supplied from focusing controller 15 to input terminal IN of power amplifier Al through amplifier 28 will be considered below.

Figure 4:
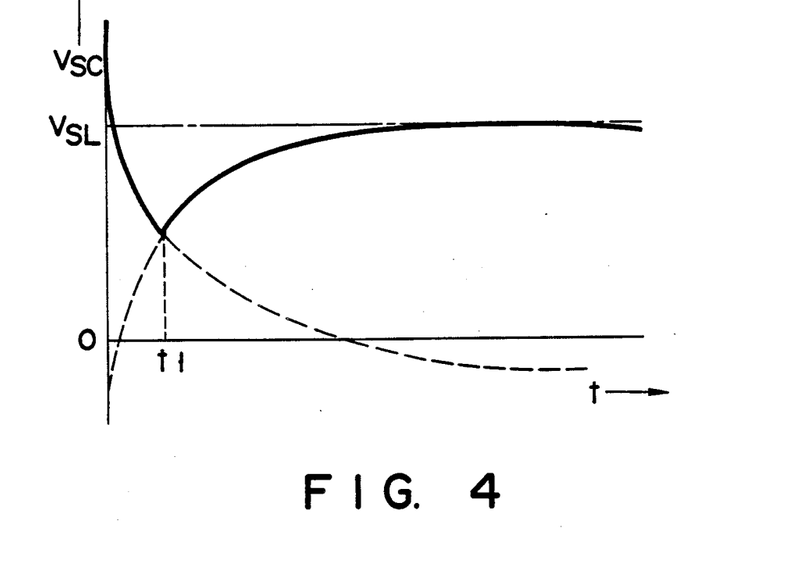
FIG. 4 is a graph showing a change in voltage at a current limiting terminal of the power amplifying apparatus in FIG. 3 as a function of time.

In this case, voltage $V_{SC}$ applied to current limiting control terminal SC of power amplifier Al is constant. Therefore, as shown in FIG. 4, voltage difference $V_{SC}$ between current limiting control terminal of power amplifier Al and the other terminal of sensing resistor $R_{SC}$ is dropped exponentially by the time constant of resistor R1 and capacitor C1 constituting the first time constant circuit until predetermined time t1 is elapsed from when the input signal is supplied (t=0), as shown in FIG. 4. After predetermined time t1 has elapsed, voltage difference $V_{SC}$ is increased exponentially by the time constant of resistor R1 and capacitor C2 constituting the second time constant circuit. Thereafter, voltage difference $V_{SC}$ indefinitely approaches threshold voltage $V_{SL}$. Threshold voltage $V_{SL}$ is determined by the following equation in accordance with load current IL flowing through driving coil 5:

$$V_{SL}=I_L R_{SC} \cdot R_f/R2$$

Figure 13:
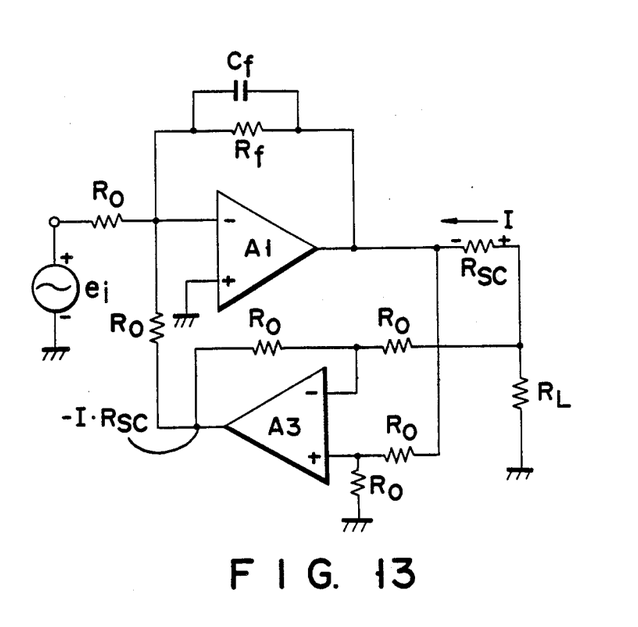
FIG. 13 is a circuit diagram showing an arrangement of a current limiter used in the power amplifying apparatus of the present invention.

FIG. 13 show s a current limiter arranged in power amplifying apparatus 32 of the present invention.

In this apparatus, operational amplifier A3 is operated when a voltage across both its input terminals, i.e., a voltage at sensing resistor $R_{SC}$, is dropped to a predetermined level, e.g., 0.9 V. Then, a voltage of $-I.R_{SC}$ (where I is an output current and $R_{SC}$ is a sensing resistance) is generated at the output of operational amplifier A3. Although input voltage ei and sensing voltage $-I \times R_{SC}$ are applied to the inverting input terminal of operational amplifier A1, output current I is limited by the characteristics of operational amplifier A1 so as to satisfy ei $= -I.R_{SC}$. Capacitor Cf is used for phase correction, and resistor Rf is used for stability adjustment.

Figure 5:
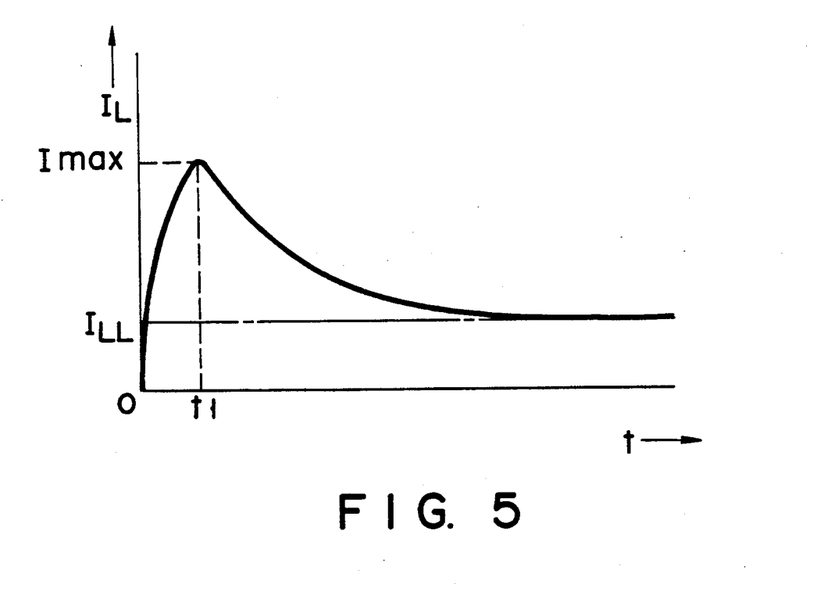
FIG. 5 is a graph showing a change in load current as a function of time when the power amplifying apparatus in FIG. 3 is used.

Referring to FIG. 3, while current limitation is effected, potential difference $V_{SL}$ across output terminal OUT and current limiting control terminal SC is kept at a constant value, e.g., 0.9 V. Therefore, current $I_L$ flowing through driving coil 5 is set to a maximum value (Imax) at predetermined time t1, as shown in FIG. 5. After this period, however, current $I_L$ is converged to maximum convergent current $I_{LL}$.

That is, predetermined time t1 and the maximum output current (Imax) at predetermined time t1 can be set to arbitrary values by properly setting time constants R1C1 and R1C2 of the first and second time constant circuits. In addition, if the value of maximum convergent current $I_{LL}$ is set to be slightly smaller than the continuous rated value, current $I_L$ larger than the continuous rated value can be flowed in driving coil 5 after the input signal is supplied for only a predetermined period of time (predetermined time t1 determined by time constant R1C1 of the first time constant circuit). In this case, when the predetermined period of time (t1) is elapsed, current $I_L$ flowing through driving coil 5 is converged to maximum convergent current $I_{LL}$. This operation can prevent an excessive current from being flowed in driving coil 5 for a long period of time.

Both terminals of sensing resistor $R_{SC}$ are connected to the input terminals of operational amplifier A2. With this arrangement, even if only a small voltage drop is obtained by sensing resistor $R_{SC}$, operational amplifier A2 can amplify this voltage drop to a predetermined level. Therefore, since only a small resistance value is required for sensing resistor $R_{SC}$, the circuit size can be reduced, and moreover, the loss in power supply voltage due to voltage $I_L R_{SC}$ dropped by sensing resistor $R_{SC}$ and the power loss due to current $I_{L2} R_{SC}$ consumed by sensing resistor $R_{SC}$ can be minimized.

As is apparent from the above-described circuit arrangement, the power amplifying apparatus of the present invention is designed such that a current-to-voltage conversion ratio is changed exponentially by the first and second time constant circuits, thereby changing the current limit value of the current limiter. With this arrangement, a current larger than a continuous rated value can be flowed in a driving coil as a load for only a predetermined period of time after an input signal is supplied.

The power amplifying apparatus of the present invention, therefore, can temporarily set the current limit value of the current limiter to be smaller than the continuous rated value so as to perform intermittent driving in focusing control or the like.

Note that in the above embodiment, the current-to-voltage conversion ratio is changed by controlling a voltage applied to the current limiting control terminal by using the first and second time constant circuits, thereby changing the current limit value of the current limiter. However, the present invention is not limited to this arrangement. For example, the current-to-voltage conversion ratio may be changed by switching the gain of an operational amplifier so as to change the current limit value of the current limiter.

Figure 6:
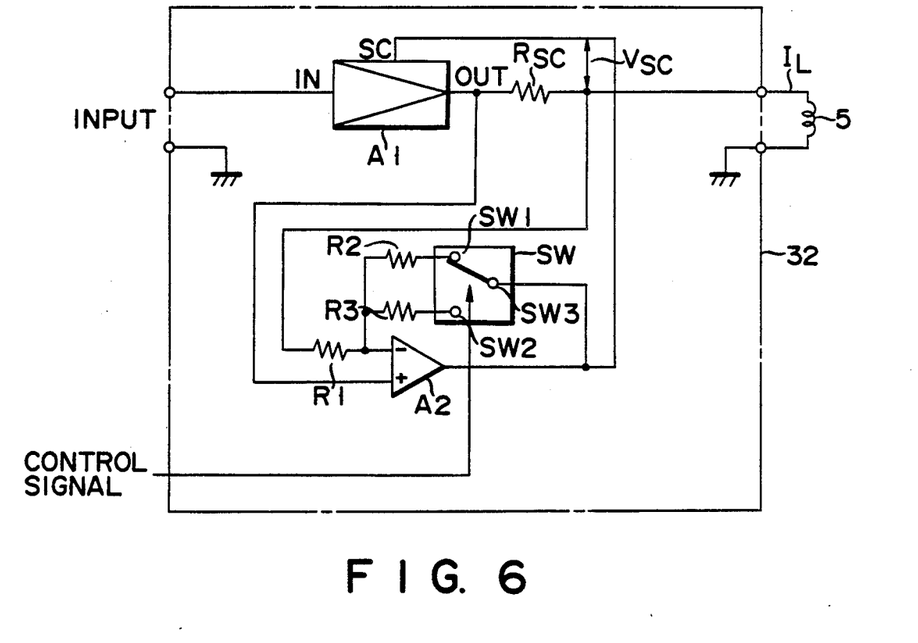
FIG. 6 is a block diagram showing a power amplifying apparatus according to another embodiment of the present invention.

This arrangement can be realized, for example, by connecting switch circuit SW constituting a gain setting circuit and operational amplifier A2 as a current-to-voltage conversion circuit between both terminals of sensing resistor $R_{SC}$, as shown in FIG. 6.

More specifically, one terminal of sensing resistor $R_{SC}$ (on the side of output terminal OUT of power amplifier A1) is connected to the noninverting input terminal of operational amplifier A2. The inverting input terminal of operational amplifier A2 is connected to the other terminal of sensing resistor $R_{SC}$ through resistor R1, to first stationary contact SW1 of switch circuit SW through resistor R2, and to second stationary contact SW2 of switch circuit SW through resistor R3. The output terminal of operational amplifier A2 is connected to current limiting control terminal (current limiting terminal) SC of power amplifier A1 and movable contact SW3 of switch circuit SW. Note that switch circuit SW is constituted by an FET analog switch or the like, and can be controlled by control signals with logic levels supplied from an external logic circuit (not shown).

Figure 7:
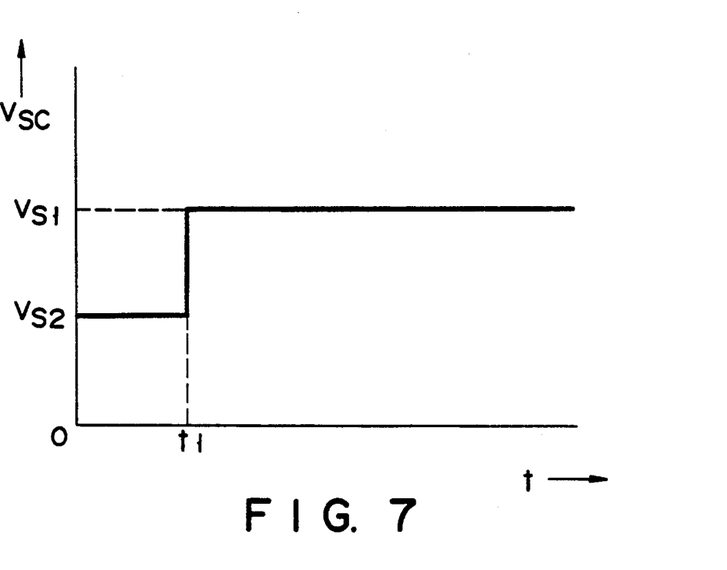
FIG. 7 is a graph showing a change in voltage at a current limiting terminal of the power amplifying apparatus in FIG. 6 as a function of time.

Assume that the value of resistor R2 is set to be smaller than that of resistor R3, and a stepwise input signal from focusing controller 15 is supplied to the input side. Switch circuit SW is set at contact SW1 until predetermined time t1 is elapsed from when the input signal is supplied (t=0). After predetermined time t1 is elapsed, switch circuit SW is set at contact SW2. After this, a voltage applied to current limiting control terminal SC of power amplifier A1 becomes constant. In other words, potential difference $V_{SC}$ between current limiting control terminal SC of power amplifier A1 and sensing resistor $R_{SC}$ is set to value $V_{S2}$ determined by resistors R2 and R1 until predetermined time t1 is elapsed, as shown in FIG. 7. After predetermined time t1 is elapsed, potential difference $V_{SC}$ is changed into value $V_{S1}$ determined by resistors R3 and R1.

Figure 8:
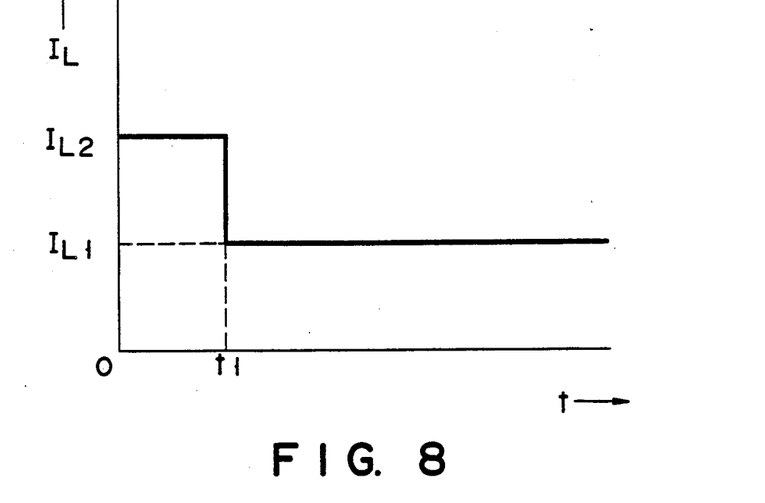
FIG. 8 is a graph showing a change in load current as a function of time when the power amplifying apparatus in FIG. 6 is used.

With this operation, current $I_L$ (load current) flowing through driving coil 5 is kept at a value represented by current $I_{L2}$ until predetermined time t1 is elapsed, and the value is then changed into a value represented by current $I_{L1}$, as shown in FIG. 8. In this case, when current $I_{L1}$ is set to a value slightly smaller than the continuous rated value, and current $I_{L2}$ is set to a value 1.5 to 2 times the continuous rated value in accordance with the duration of predetermined time t1, current $I_L$ exceeding the continuous rated value can be temporarily obtained by externally controlling switch circuit SW and switching gains.

As shown in FIG. 6, both terminals of sensing resistor $R_{SC}$ are connected to the input terminals of operational amplifier A2. With this arrangement, even if only a small voltage drop is obtained by sensing resistor $R_{SC}$, this voltage drop can be amplified by operational amplifier A2 to a predetermined level. Therefore, since sensing resistor $R_{SC}$ requires only a small resistance value, the circuit size can be reduced, and moreover, the loss in power supply voltage due to voltage $I_L R_{SC}$ dropped by sensing resistor $R_{SC}$ and the power loss due to voltage $I_L^2 R_{SC}$ consumed by sensing resistor $R_{SC}$ can be minimized.

Furthermore, since switch circuit SW can be controlled by control signals with logic levels, it can be controlled by an external CPU (central processing unit) or a timer (neither of which are shown).

The level of current limited by the current limiter can be changed also when the gain of the operational amplifier is changed by externally controlling voltage applied to the current limiting control terminal and changing the current-to-voltage conversion ratio in this manner.

That is, the current limit value of the current limiter can be changed by external control. With this arrangement, the current limit value of the current limiter can be temporarily set to be larger than the continuous rated value. Therefore, a current exceeding the continuous rated value can be flowed in driving coil 5 as needed.

Figure 9:
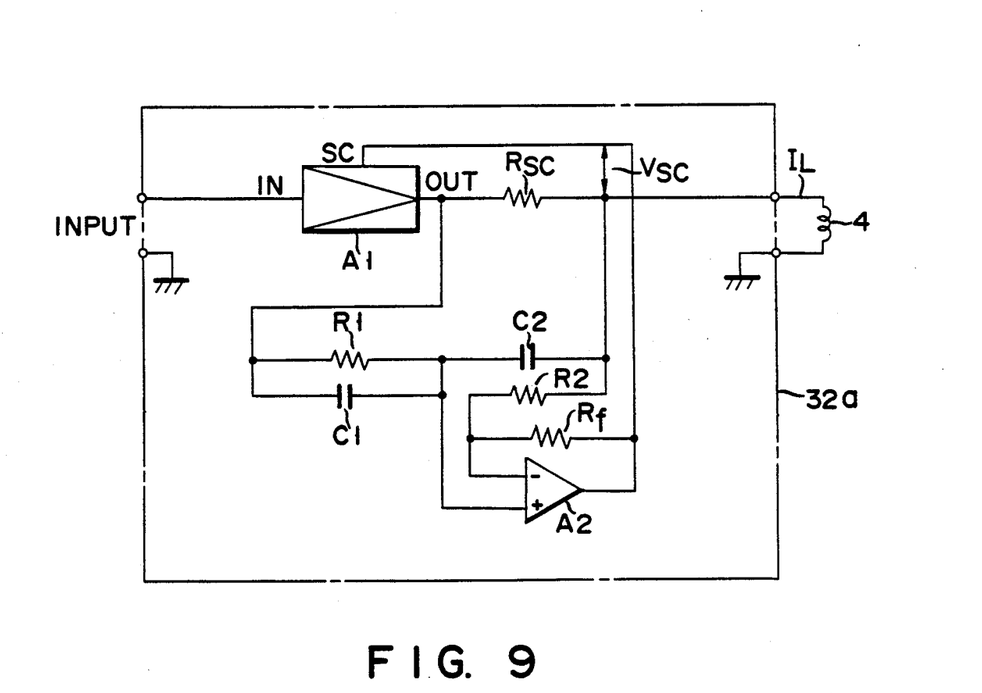
FIG. 9 is a block diagram showing the power amplifying apparatus in FIG. 3 using a tracking control driving coil as a load.
Figure 10:
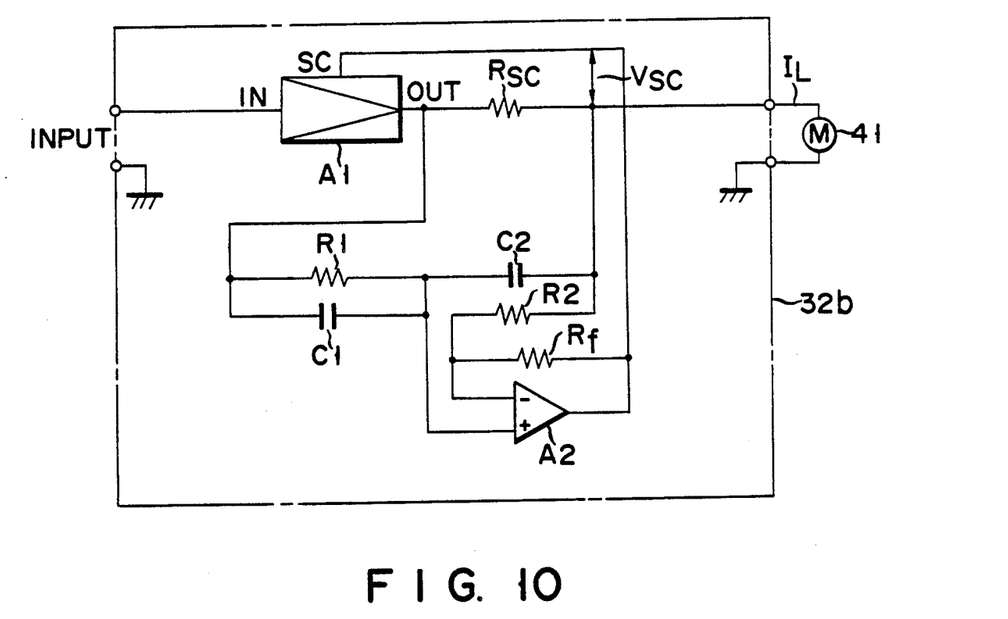
FIG. 10 is a block diagram showing the power amplifying apparatus in FIG. 3 using a linear motor for moving an optical pickup as a load.

The power amplifying apparatus for driving the driving coil used in focusing control has been described. However, the above description applies also to driving coil 4, which is used in tracking control, as shown in FIG. 9. In addition, it can also be applied when driving coil 13 used for linear motor 41 for moving optical pickup 3 is used as a load, as shown in FIG. 10.

Figure 11:
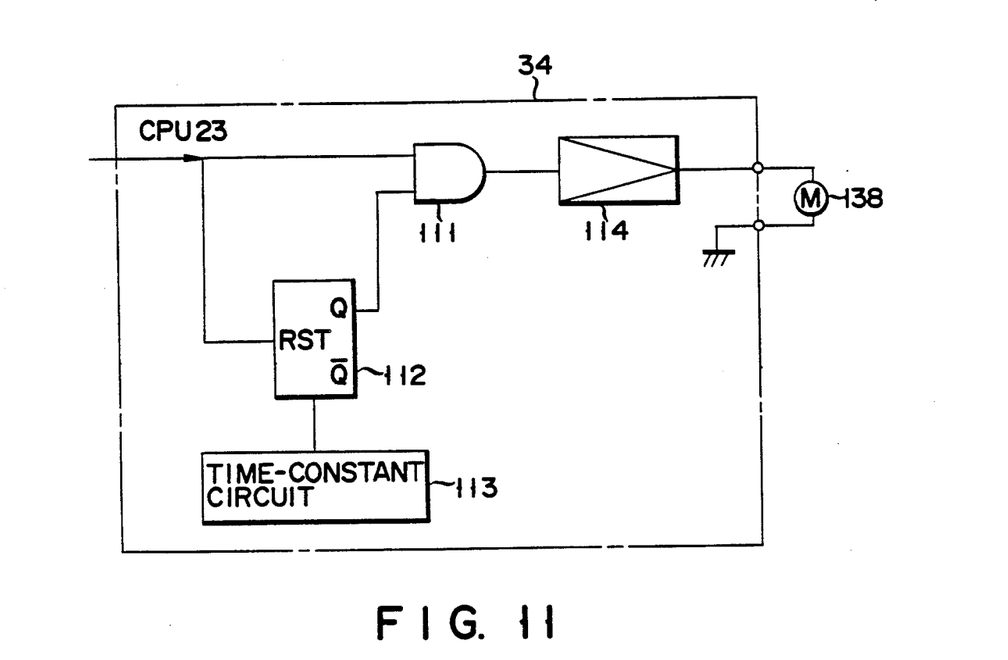
FIG. 11 is a block diagram showing another embodiment of the present invention.

FIG. 11 shows a power amplifying apparatus according to another embodiment of the present invention. Power amplifying apparatus 34 is applied to a disk loading mechanism such as shown in FIG. 2.

Power amplifying apparatus 34 comprises AND gate 111, one-shot multivibrator (F/F circuit) 112, time constant circuit 113, and power amplifier 114. One input terminal of AND gate 111 is connected to output terminal of one-shot multivibrator (F/F circuit) 112, and the other input terminal of AND gate 111 receives a control signal such as a loading command signal from CPU 23. This control signal is also supplied to reset terminal RST of one-shot multivibrator (F/F circuit) 112. Time constant circuit 113 is connected to F/F circuit 112. Power amplifier 114 is connected to the output terminal of AND gate 111. Driving motor 138 is connected to the output terminal of power amplifier 114 as a load.

Assume that in such a circuit arrangement, a control signal with a logic level is supplied from CPU 23 to one input terminal of AND gate 111 and reset terminal RST of F/F circuit 112 as an input signal. When the input signal is at high level (active), F/F circuit 112 is set in a reset state by this input signal, and is kept in the ON (active) state for a predetermined period of time determined by time constant circuit 113. After this period, F/F circuit 112 is returned to the OFF (inactive) state.

As apparent from FIG. 11, AND gate 111 is set at high level as long as F/F circuit 112 is kept in the ON state. Therefore, even if the input signal is kept at high level for a period of time longer than a time when F/F circuit 112 is kept in the ON state, since F/F circuit 112 is turned off after the period of time determined by time constant circuit 113, the input conditions of AND gate 111 are not satisfied, and the output from AND gate 111 is set at low level.

Similarly, when the input signal is set at low level within a period of time shorter than the time when F/F circuit 112 is kept in the ON state, the output from AND gate 111 is set at low level. With this operation, an output from power amplifier 114 is set at low level.

In addition, when F/F circuit 112 is triggered again by noise or the like, an input signal does not appear at the output terminal of power amplifier 114 as long as the input signal is in a low-level state.

Figure 12:
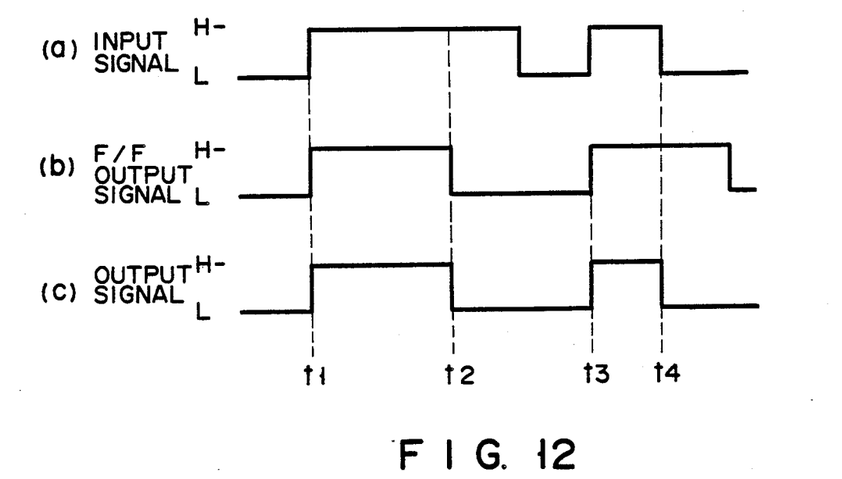
FIG. 12 is a timing chart for explaining an operation of the power amplifying apparatus in FIG. 11.

An operation of the above-described arrangement will be described with reference to a timing chart in FIG. 12. Assume that a high-level (active) signal is supplied as an input signal. F/F circuit 112 supplies a signal, which is kept at high level for a predetermined period of time determined by time constant circuit 113, to AND gate 111.

Subsequently, AND gate 111 supplies a signal, which is kept at high level while F/F circuit 112 is in the ON (active) state and the input signal is kept at high level, to power amplifier 114. More specifically, if the input signal is kept at high level for a period of time longer than the time when F/F circuit 112 is kept in the ON state as indicated by t1-t2 in FIG. 12, the output from AND gate 111 is set at low level when F/F circuit 12 is set in the OFF (inactive) state. If the input signal is kept at low level within the period in which F/F circuit 12 is kept in the ON state, the output from AND gate 111 is set at low level when the input signal is set OFF, as indicated by t3-t4 in FIG. 12. Thus, power amplifier 114 is operated in accordance with outputs from AND gate 111. Power amplifier 114 supplies a current to driving motor 133 while a high-level signal is supplied from AND gate 111. Driving motor 138 is driven by the current supplied from power amplifier 114.

As has been described above, the time during which a signal with a logic level is kept in the ON state is controlled by the F/F circuit and the time constant circuit, thereby preventing a current from flowing in the driving motor as a load over a predetermined period of time.

More specifically, by controlling input to the power amplifier, a current supplied to the load can be cut off after a predetermined period of time even if an input signal is fixed to a high-level (active) state due to over-running of a program or the like. With this operation, troubles such as overheat in a load and an amplifier can be prevented. Especially in a power amplifying apparatus used for intermittent driving such as loading of an optical disk, heat dissipation design of this circuit and a load can be easily facilitated. Therefore, the load can be protected against an excessive loading.

In the above-described embodiment, the apparatus according to the present invention is ON-operated by a high-level (active) signal. However, the present invention is not limited to this. For example, the apparatus may be ON-operated by a low-level (inactive) signal. In this case, an input signal and inverted output $\overline{Q}$ from a one-shot multivibrator may be supplied to an inverter AND gate.

Various changes and modifications can be made without departing from the spirit and scope of the invention.

What is claimed is:

1. A power amplifying apparatus for amplifying an output signal to drive a load, comprising:
   means for amplifying the input signal for generating an output signal for driving said load;
   means for converting the output signal current generated by said amplifying means to a voltage and feeding back the converted voltage to said amplifying means for controlling an amplitude of the output signal which flows into the load; and
   means for determining a current-to-voltage conversion ratio of said converting means, wherein the amplitude of the converted voltage converted by said converting means may be controlled in accordance with the current-to-voltage conversion ratio, said determining means including a first time constant circuit for decreasing the amplitude of the output signal and a second time constant circuit for increasing the amplitude of the output signal.

2. An apparatus according to claim 1, wherein said first time constant circuit comprises a resistor and a capacitor for determining a time constant of said first time constant circuit.

3. An apparatus according to claim 1, wherein said second time constant circuit comprises a resistor and a capacitor for determining a time constant of said second time constant circuit.

4. A power amplifying apparatus for amplifying an input signal to drive a load, comprising:
   means for amplifying the input signal for generating an output signal for driving said load;
   means for converting the output signal current generated by said amplifying means to a voltage and for feeding back the converted voltage to said amplifying means for controlling an amplitude of the output signal which flows into the load; and
   means for determining a current-to-voltage conversion ratio of said converting means, wherein the amplitude of the converted voltage converted by said converting means may be controlled in accordance with the current-to-voltage converting ratio, said converting means including an operational amplifier for amplifying the output signal in accordance with the current-to-voltage conversion ratio, a first time constant circuit for decreasing the amplitude of the output signal and a second time constant circuit for increasing the amplitude of the output signal.

5. An apparatus according to claim 4, wherein said determining means comprises a switch for selectively switching a gain of said operational amplifier for selecting the current-to-voltage conversion ratio.

6. An apparatus according to claim 4, wherein said power amplifying apparatus is used to drive a driving coil for focusing control of an optical disk.

7. An apparatus according to claim 4, wherein said power amplifying apparatus is used to drive a driving coil for tracking control of an optical disk.

8. An apparatus according to claim 4, wherein said power amplifying apparatus is used to drive a driving coil for driving a dc motor for an optical pickup.

9. An apparatus according to claim 4, wherein said first time constant circuit comprises a resistor and a capacitor for determining a time constant of said first time constant circuit.

10. An apparatus according to claim 4, wherein said second time constant circuit comprises a resistor and a capacitor for determining a time constant of said second time constant circuit.

11. An apparatus according to claim 1, wherein said converting means comprises an operational amplifier for amplifying the output signal in accordance with the current-to-voltage converting ratio.

12. An apparatus according to claim 1, wherein said power amplifying apparatus is used to drive a driving coil for focusing control of an optical disk.

13. An apparatus according to claim 1, wherein said power amplifying apparatus is used to drive a driving coil for tracking control of an optical disk.

14. An apparatus according to claim 1, wherein said power amplifying apparatus is used to drive a driving coil for driving a dc motor for an optical pickup.

15. An apparatus according to claim 11, wherein said determining means comprises a switch for selectively switching a gain of said operational amplifier for selecting the current-to-voltage conversion ratio.

16. A power amplifying apparatus for amplifying an input signal to drive a load, comprising:
   means for amplifying said input signal and for transmitting said input signal to said load; and
   means for preventing amplification of said input signal in response to the absence of said input signal and, also, in response to a duration of said input signal greater than a predetermined time period, said amplification prevention means including an AND gate, responsive to the presence of said input signal and the presence of said input signal for said predetermined time period, for transmitting said input signal to said amplifying means.

17. An apparatus according to claim 16, wherein said amplification preventing means includes a monostable multivibrator for preventing said input signal from being transmitted to said amplifying means after said predetermined time period has elapsed.

18. An apparatus according to claim 17, wherein said amplification preventing means further includes a time constant circuit for determining said predetermined time period.

* * * * *

UNITED STATES PATENT AND TRADEMARK OFFICE
CERTIFICATE OF CORRECTION

PATENT NO. : 4,992,758

DATED : February 12, 1991

INVENTOR(S) : Ryoji Takeuchi

It is certified that error appears in the above-identified patent and that said Letters Patent is hereby corrected as shown below:

Claim 1, column 9, line 27, change "output" to --input--.

Signed and Sealed this

Thirteenth Day of July, 1993

Attest:

MICHAEL K. KIRK

*Attesting Officer*     Acting Commissioner of Patents and Trademarks